United States Patent [19]

Bean et al.

[11] Patent Number: 4,879,256

[45] Date of Patent: Nov. 7, 1989

[54] METHOD OF CONTROLLING THE ORDER-DISORDER STATE IN A SEMICONDUCTOR DEVICE

[75] Inventors: John C. Bean, New Providence; Abbas Ourmazd, Middletown, both of N.J.

[73] Assignee: AT&T Bell Laboratories, Murray Hill, N.J.

[21] Appl. No.: 331,063

[22] Filed: Mar. 28, 1989

Related U.S. Application Data

[63] Continuation of Ser. No. 43,562, Apr. 28, 1987, now abandoned, which is a division of 741,636, Jun. 5, 1985, now U.S. Pat. 4,661,829.

[51] Int. Cl.$^4$ .......................................... H01R 21/20
[52] U.S. Cl. ................................. 437/131; 437/247; 357/16; 357/4
[58] Field of Search .................. 437/131, 247, 225; 357/4, 4 SL, 16; 148/DIG. 3, DIG. 4, DIG. 94, DIG. 160, DIG. 59

[56] References Cited

U.S. PATENT DOCUMENTS

| | | | |
|---|---|---|---|
| 4,093,453 | 6/1978 | Makino et al. | 420/77 |
| 4,205,329 | 5/1980 | Dingle et al. | |
| 4,261,771 | 4/1981 | Dingle et al. | 156/610 |
| 4,529,455 | 7/1985 | Bean et al. | 156/610 |
| 4,661,829 | 4/1987 | Bean et al. | 357/4 |

OTHER PUBLICATIONS

Hagiwara et al., "Ordering and Disordering Behaviors in δ-VMn Alloys", Trans. JIM, vol. 18, 1977, pp. 239-246.

Manasevit et al., "The Properties of Si/Si$_{1-x}$Ge$_x$ Films Grown on Si Substrates by Chemical Vapor Deposition", J. of Electronic Materials, vol. 12, No. 4, 1983, pp. 637-650.

Ourmazd et al., "Observation of Order-Disorder Transitions in Strained-Semiconductor Systems", Physical Review Letters, vol. 55, No. 7, Aug. 12, 1985, pp. 765-768.

Ourmazd et al., "Order-disorder Transitions in Strained Semiconductor Systems", SPIE vol. 623 Advanced Processing and Characterization of Semiconductors III (1986), pp. 2-7.

Cullity *Elements of X-Ray Diffraction*, Addison-Wesley Publishing Company, Inc., 1978.

*Thermodynamics of Solids*, Richard A. Swalin et al., pp. 153-159.

*Constitution of Binary Alloys*, McGraw-Hill Book Company, 1958, pp. 774-775.

*Journal of Vacuum Science and Technology*, A2, 1984, pp. 436-440.

*Annalen der Physik*, 30, 1937, pp. 151-164.

*Primary Examiner*—Brian E. Hearn
*Assistant Examiner*—M. Wilczewski
*Attorney, Agent, or Firm*—P. A. Businger

[57] ABSTRACT

An ordered-disordered transition is observed in semiconductor alloys which enables either the ordered or disordered structure to be produced.

6 Claims, 2 Drawing Sheets

○ Si
● Ge

METHOD OF CONTROLLING THE ORDER-DISORDER STATE IN A SEMICONDUCTOR DEVICE

This application is a continuation of application Ser. No. 043,562, filed on Apr. 28, 1987, abandoned, which is a division of 741,636, filed June 5, 1985, now U.S. Pat. No. 4,661,829.

TECHNICAL FIELD

This invention relates generally to the field of semiconductor devices and particularly to such devices using ordered semiconductor alloys and to a method of controlling the order-disorder state in such alloys.

BACKGROUND OF THE INVENTION

Although the most commercially used semiconductor today is silicon, there are other semiconductors, such as GaAs and InP, that are presently of commercial and technological interest. Unlike silicon which, except for minor amounts of elements which are typically present to determine the conductivity type and unwanted impurities, is an elemental semiconductor, these other semiconductors are often alloys. That is, they have two or more major atomic constituents present as well as minor amounts of dopants and impurities. In addition to the GaAs and InP previously mentioned, other alloy semiconductors which are presently of possible commercial interest are GeSi, AlGaAs, AlInAs, and InGaAsP. The subscripts typically used to indicate the precise composition have been omitted for reasons of conciseness.

The semiconductor alloys are typically grown epitaxially on substrates or other epitaxial layers which may have the same or a different composition. For example, AlGaAs and GeSi may be grown on GaAs and Si, respectively. If the compositions differ, the lattice constants almost invariably differ and a strain is present in the epitaxial layers.

In these semiconductor alloys, the isoelectronic constituent atomic species occupy random sites in the lattice. Isoelectronic means that the atomic species have the same valence electrons. Such a structure may be viewed as being disordered as there is no long range correlation between the positions of a particular isoelectric species. However, ordered alloys are known and ordered semiconductor alloys have been observed. For example, U.S. Pat. No. 4,205,329 issued on May 27, 1980 to Dingle, Gossard, Petroff and Wiegmann (Gossard et al) describes a superlattice comprising a periodic structure of $(GaAs)_n (AlAs)_m$ where n and m are the numbers of contiguous monolayers of GaAs and AlAs, respectively.

Transitions between a disordered structure and an ordered structure are relatively common and well studied in metallic alloys. The appropriate annealing of such systems at temperatures lower than a critical temperature induces the different constituent atoms to occupy particular lattice sites and to thereby produce long-range order in the resulting structure. The transition can be one of two types. First, it can be isostructural and the lattice type is not changed by the transition. Secondly, it can be neostructural and the lattice type is changed by the transition. The transitions may be driven by various physical mechanisms including differences in electronegativity, valence electron number or size between the ordering atoms. The thermodynamics of the transition is discussed in, for example, *Thermodynamics of Solids*, Richard A. Swalin, John Wiley and Sons, pp. 153–159. The particular order-disorder transition discussed by Swalin includes the transition present in Cu-Au alloys.

However, such order-disorder transitions are not known in semiconductors. For example, bulk GeSi is a model random alloy. In spite of experiments in which prolonged annealing has been performed on bulk GeSi at various temperatures, such annealing has been unable to induce the different atomic species to occupy specific lattice sites and the alloy appears to obey ideal solution theory. See, for example, *Constitution of Binary Alloys*, McGraw-Hill Book Company, 1958, pp. 774–775. Such transitions were not described by Gossard et al.

SUMMARY OF THE INVENTION

We have found that the strain present in a strained-superlattice semiconductor system can be used to drive an order-disorder phase transition in semiconductor alloys including GeSi/Si. The alloy desirably has at least two isoelectronic atomic species. The order-disorder phase transition is neostructural reversible with the order being produced by slow cooling from a temperature near, but below, the transition temperature and the disorder being produced by quenching from a temperature above the transition temperature. The transition temperature for $Ge_xSi_{1-x}$ is approximately 450 degrees C and a cooling rate of approximately 2 degrees/minute produces a high degree of long-range order for values of x that are approximately 0.5. The ordered structure is unusual and consists of [111] atomic layers having the sequence SiSiGeGeSiSiGeGe.... Ordered is used to mean that the different constituent atoms occupy special sites in the lattice and there is long range order in the resultant structure. Disordered means these effects are absent. Devices comprising a strained SiGe superlattice exhibiting the ordered arrangement are also contemplated and discussed.

DETAILED DESCRIPTION

Figure 1:
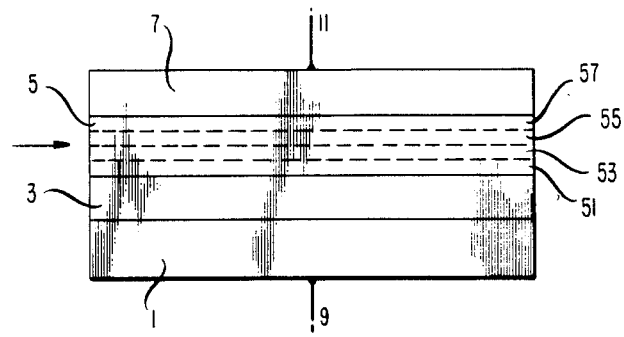
FIG. 1 is a sectional view of an exemplary embodiment of this invention.

FIG. 1 is a sectional view of an exemplary device according to the invention which can undergo an order-disorder transition. Depicted are substrate 1, first layer 3, strained superlattice 5, and second layer 7. The first layer is typically present to provide a high quality epitaxial layer for the growth of the superlattice. The strained superlattice comprises a plurality of semiconductor layers indicated as 51, 53, 55, and 57. More layers will typically be present but are omitted for reasons of clarity. The plurality comprises interleaved first and second semiconductor layers which have first and second compositions, respectively. At least one of these layers comprises a semiconductor alloy and at least one of the layers has a lattice constant different from that of the substrate or other layer. The alloy desirably has at least two isoelectronic atomic species. The mismatch is accommodated by strain rather than by misfit dislocations. The number of misfit dislocations should be small and is typically less than $10^4/cm^2$. Also depicted are electrical contacts 9 and 11 to the substrate 1 and second layer 7, respectively. The arrow represents a light beam.

Figure 2:
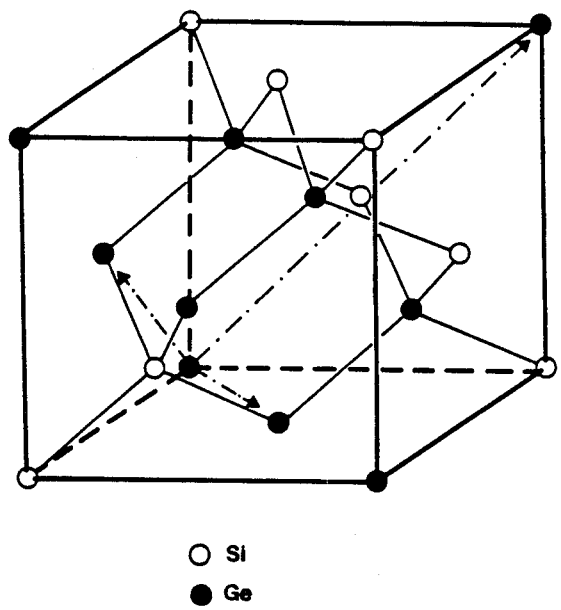
FIG. 2 represents the ordered GeSi unit cell.

In one preferred embodiment, the substrate as well as the first and second layers comprised Si, and the strained superlattice comprised alternating layers of Si and GeSi. The substrate was [100] Si. The composition of the GeSi layer may vary over a wide range, that is, if the composition is represented as $Ge_xSi_{1-x}$, x may have any value greater than 0.0 and less than or equal to 1.0. The ideal ordered arrangement is depicted in FIG. 2 which shows the ideal $Ge_xSi_{1-x}$ unit cell for a value of x=0.5. As can be seen, there are two planes of Si atoms, indicated as open circles, followed by two planes of Ge atoms, indicated as closed circles, etc. If x is greater than 0.5, there is an ordered substitution of the excess species, i.e., Ge, on the other planes normally occupied by the other species. If x is less than 0.5, there is incomplete order.

The particular number of layers and their thicknesses are determined by the requirement that the strain be maintained in the superlattice. As will be evident from the following discussion, a significant difference in the lattice constants of the two semiconductors may facilitate the formation of the ordered state with thin layers. For a lesser difference in lattice constant, thicker layers will be required.

It should be understood that other embodiments are contemplated. For example, the substrate might be Ge rather than Si. Additionally, other alloy semiconductors may be used. For example, the superlattice might be AlGaAs/GaAs grown on a GaAs substrate. This system appears less preferred than the GeSi/Si system because the small difference in the GaAs and AlGaAs lattice constants makes the production of large strain energy in thin layers difficult. However, those skilled in the art readily realize that there are many semiconductor alloy systems where large lattice mismatches can be achieved.

The GeSi/Si strained superlattice depicted was grown by molecular beam epitaxy on [100] silicon as described in detail in the literature and now well known to those skilled in the art. See, for example, *Journal of Vacuum Science and Technology*, A2, pp. 436–440, 1984. Molecular beam epitaxy appears at present to be a preferred growth technique for the GeSi/Si strained superlattice because of the possibility of growing the strained superlattice with a minimal number of misfit dislocations and minimal layer interdiffusion. The structure so grown appears to be devoid of extended defects and possesses, as is desirable, commensurate GeSi/Si interfaces. However, other growth techniques are possible.

Particular results leading to a determination of parameters critical to the order-disorder transition will be described with respect to a 20 period GeSi superlattice grown at 550 degrees C with each period consisting of a 75 Angstrom layer of $Ge_{.4}Si_{.6}$ and a 225 Angstrom layer of Si. Strain in the superlattice is accommodated almost entirely in the alloy layers, that is, the GeSi layers, and produces a tetragonal distortion of the unit cell. The structures were annealed in an argon atmosphere at several temperatures within the range extending from 350–550 degrees C and were cooled at different rates or, alternatively, quenched in diffusion pump oil. [011] and [001] cross-sectional samples were polished and ion beam milled, with the resulting damage being removed by a final radiation with 2 keV argon ions. This treatment was deemed desirable because it permitted examination of the bulk sample with minimum interference from residual surface damage.

Electron diffraction patterns revealed several unexpected features. In particular, there was substantial streaking through spots including the undiffracted beam, and extra reflections occurred at several positions. The intensity of the reflections depended upon the precise annealing treatment performed on that sample. It was thus clear that the appropriate annealing treatment could cause the presence or absence of these reflections, i.e., it could cause significant changes in intensity. The reflections occurred most strongly when the sample, i.e., x=0.4, was annealed at approximately 450 degrees C and cooled at approximately 2 degrees C per minute. They disappeared if the sample was given a subsequent anneal at a temperature higher than 450 degrees C followed by quenching. However, an additional annealing at 450 degrees C followed by slow cooling caused their reappearance.

Figure 3:
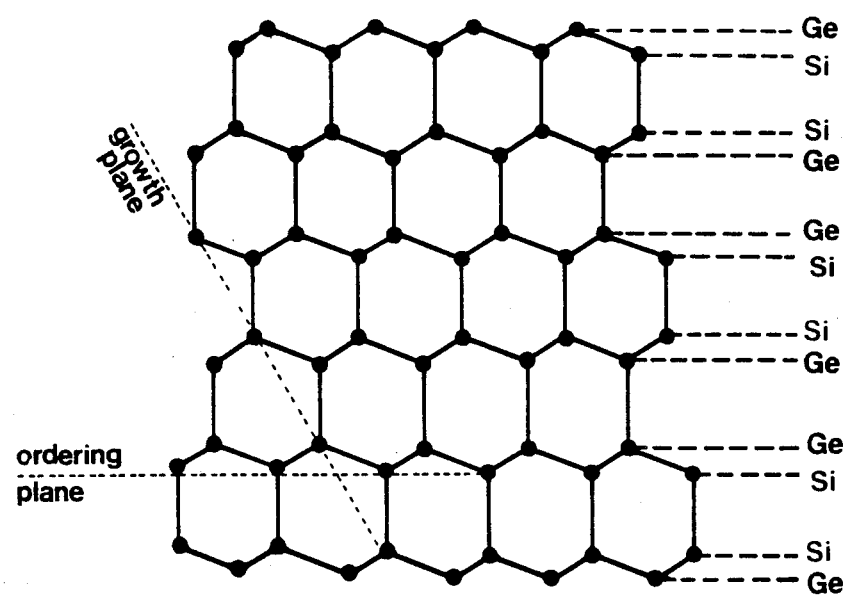
FIG. 3 is a representation showing the growth and ordering planes of the SiGe alloy.

The streaking parallel to the [100] growth direction was present in all samples, and the length of the streak did not increase with the diffraction vector, and since the undiffracted beam also displayed streaking, strain can be ruled out as the cause. Thus, the streaks must be due to sheet-like inhomogenities in the sample. The observed structure deduced from the above results may be described as a super-position of domains having a pseudodiamond structure in which the stacking in a single <111> direction consists of (111) planes composed entirely of one atom in the sequence SiSiGeGeSiSi . . . as shown in FIG. 2. Although the ordering is expected to produce a slight trigonal distortion of the unit cell, this distortion is not measurable by electron diffraction. The growth and ordering planes are depicted in FIG. 3. FIG. 3 is the <110> projection of the ordered structure. This structure is very unusual, and can be related to the ordered form of CuPt, which has a face-centered cubic lattice. See, for example, *Annalen der Physik*, 30, pp. 151–164, 1937.

The structure may also be fabricated in the ordered state by growing two monolayers of Ge followed by two monolayers of Si, etc. However, Ge and Si are totally miscible, and it might be expected that the monolayers would intermix and that the structure would be unstable. The order-disorder transition shows that the ordered structure occurs and is stable. It can be grown in the ordered state and will not deteriorate although the order can be destroyed by an appropriate annealing step.

The order decreases after prolonged annealing and is not observed in the thinnest regions of electron-transparent structures. We also observed that a prolonged annealing, that is, for a time greater than 30 hours at 450 degrees C, reduces the stress due to Ge out diffusion from the alloy layers and thus reduces the degree of order. The stress is also able to relax in thin foils and the ordered thin layer is superheated during the thinning process, thereby becoming disordered by the energy input from the incident ion beam. Thus, long-range order is destroyed. We therefore believe that the ordering transition is strained-driven and stabilized and is operative in other semiconductor alloy systems such as AlGaAs/GaAs.

It will be readily appreciated that the critical temperature is a function of composition and increases as the Ge content increases. More generally, the critical temperature increases as the strain in the superlattice increases. For the transition to occur, the critical temperature must be high enough so that there is sufficient thermal energy for ordering to occur but not high enough to homogenize the lattice. As the strain increases, the ordered site becomes more favorable because the strain is accommodated more efficiently by the ordered state. If the critical temperature is exceeded, the available thermal energy is sufficient to overcome the energy reduction due to ordering and the ordered structure is destroyed. In other words, if the energy gain from ordering is not greater than kT, the ordered structure is not stable.

The annealing time must be sufficient for ordering or disordering to occur but should not be so long that the more mobile species leaves the alloy layer. The quenching should be sufficiently rapid that there is no time for ordering.

The strain is accommodated primarily by the Ge layers while the Si layers are unstrained. More particularly, the GeSi bond angle changes to accommodate the strain and two layers of each species is the most efficient way to order the structure. The structure always orders in the [111] direction although the superlattice may be grown on any substrate orientation including <111>.

Numerous interesting device applications are readily thought of by those skilled in the art for the structure depicted. It will be readily appreciated that the unit cell of this structure has doubled the [111] periodicity of the normal unit cell of the diamond structure and that the periodicity differs from those of elemental Ge and Si. This results in folding of the Brillouin zone in the [111] direction and produces a direct band gap for those alloys having high Ge content, i.e., for alloys having x greater than 0.7. The unit cell itself it no longer centrosymmetric and certain optical phenomenon, such as second harmonic generation, optoelectro and piezoelectric effects become structurally allowed. The structure of FIG. 1 is useful for these applications.

The production of a direct band gap material in the GeSi system leads to the fabrication of optical devices utilizing GeSi such as photodetectors, as well as light sources such as diodes and lasers. It is noted that the band gap of this material system, 1 micron and longer, makes such devices ideal for presently contemplated communication systems. Again, the structure of FIG. 1 is useful and it will be readily appreciated by those skilled in the art that the first and second layers will have opposite conductivity types.

The ordered GeSi is useful for optical purposes such as waveguiding, electro-optic applications including modulators and optical switches. The latter two types of devices may also use the piezoelectric effect. The incident light beam is shown by the arrow in FIG. 1. These uses are of interest for a combined as well as integrated electronic and optical processing and signal and data communication. It will be appreciated that the optical components may be integrated with electronic components on the silicon substrate. The latter components are electrically connected to the optical components.

Figure 4:
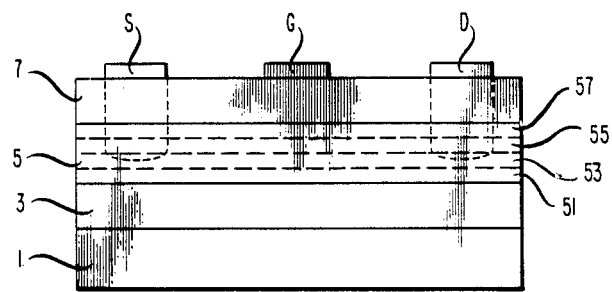
FIG. 4 is a view of a transistor according to this invention.

The ordered alloy also exhibits reduced charge carrier scattering and is useful as the channel in a field-effect transistor. The structure of FIG. 4 is useful for these applications. Numerals identical to those in FIG. 1 represent identical elements. However, source, gate and drain electrodes have been added. They are shown as S, G and D, respectively. As will be readily appreciated, well known techniques may be used to form these electrodes.

Figure 5:
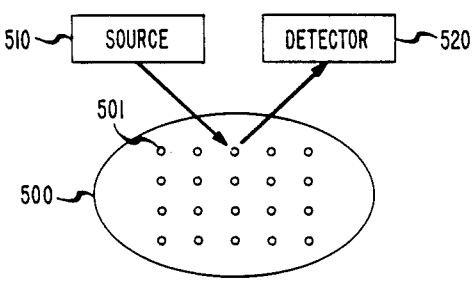
FIG. 5 is a view of an optical recording device according to this invention.

The order-disorder transition may be used for the fabrication of optical data storage media with erasability. The material may be ordered by annealing and slow cooling and a focussed light beam, such as a laser beam, can locally disorder the alloy by heating to a temperature above the critical temperature, followed by quenching the material when the beam is switched off. A suitable structure is depicted in FIG. 5. Depicted are a layer of material 500, e.g., silicon, on which are a plurality of storage cells 501 which undergo an order-disorder transition. Also shown is a light source, e.g., a laser 510. Well known means are used to scan the light to the different storage cells. Photodetector 520 is used to measure the intensity of the reflected light. The disordered material has a different reflectivity due to its different band structure and unit cell symmetry. The stored data may be read by the simple detection of reflectivity changes using photodetector 520 as the surface is scanned by a light beam. The stored material may be erased by heating to a temperature above the critical temperature and cooling slowly.

It will be readily appreciated that the amount of silicon present may vary over the range from x=0.1 to x=0.9. Values below 0.1 are undesirable because order is very small and not likely to be useful. Larger values are undesirable for the same reason. As will be readily appreciated, the precise value selected will depend upon the contemplated device use.

It will also be readily appreciated that the above teaching enables the skilled artisan to fabricate the superlattice in either the ordered or disordered state.

What is claimed is:

1. In the manufacture or use of a semiconductor device, a method for ordering at least a disordered portion of at least one semiconductor-alloy epitaxial layer comprising $Ge_xSi_{1-x}$, x greater than or equal to 0.0 and less than or equal to 1.0, said method comprising a step of heating said portion to a temperature which lies below a critical temperature, said heating being applied as said layer is in a strained state.

2. In the manufacture or use of a semiconductor device, a method for disordering at least an ordered portion of at least one semiconductor-alloy epitaxial layer comprising $Ge_xSi_{1-x}$, x greater than or equal to 0.0 and less than or equal to 1.0, said method comprising the steps of heating said portion to a first temperature which lies above a critical temperature, said heating being applied as said layer is in a strained state, and cooling the now-disordered portion to a second temperature sufficiently below said critical temperature, and at a rate sufficient to essentially retain disordering of said portion.

3. The method of claim 1 or 2, said heating being by exposure to a light beam.

4. The method of claim 3, further comprising scanning said beam.

5. The method of claim 3, further comprising detecting light reflected from said portion.

6. The method of claims 1 or 2, x being greater than or equal to 0.1 and less than or equal to 0.9.

* * * * *